(12) United States Patent
Koai et al.

(10) Patent No.: US 6,176,930 B1
(45) Date of Patent: Jan. 23, 2001

(54) APPARATUS AND METHOD FOR CONTROLLING A FLOW OF PROCESS MATERIAL TO A DEPOSITION CHAMBER

(75) Inventors: Keith K. Koai, Los Gatos; Tung-Ching Tseng, Sunnyvale; James J. Chen; Mark S. Johnson, both of San Jose; John Schmitt; Sean Li, both of Sunnyvale, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/262,756

(22) Filed: Mar. 4, 1999

(51) Int. Cl.[7] ................................. C23C 16/00
(52) U.S. Cl. .............. 118/715; 118/726; 427/248.1; 427/255.1
(58) Field of Search ................. 118/723, 726, 118/719, 727, 724, 715; 261/146, 76; 251/129.15; 427/255.1, 248.1; 219/271; 417/387

(56) References Cited

U.S. PATENT DOCUMENTS

| 4,748,313 | * | 5/1988 | Rudnay | 219/271 |
|---|---|---|---|---|
| 4,875,658 | * | 10/1989 | Asai | 251/129.15 |
| 5,268,034 | | 12/1993 | Vukelic | 118/719 |
| 5,299,919 | * | 4/1984 | Paul et al. | 417/387 |
| 5,919,332 | * | 7/1999 | Koshiishi et al. | 156/345 |
| 5,989,635 | * | 11/1999 | Kawahara et al. | 427/255.32 |

OTHER PUBLICATIONS

"Cu–CVD Process Optimised in a Cluster Equipment for IC Manufacturing", Marcadal et al., Microelectronic Engineering 33 (1997) 3–13. (no month).

* cited by examiner

Primary Examiner—Gregory Mills
Assistant Examiner—P. Hassanzadeh
(74) Attorney, Agent, or Firm—Thomason, Moser & Patterson

(57) ABSTRACT

An apparatus and method for controlling a flow of process material to a deposition chamber. The apparatus comprises an injector valve, disposed between the process material source and the deposition chamber. The injector valve controls the flow of precursor material by repeatedly opening and closing the injector valve with a predetermined duty cycle. The apparatus further comprises an evaporator coupled to the injector valve for evaporating the precursor.

18 Claims, 10 Drawing Sheets

APPARATUS AND METHOD FOR CONTROLLING A FLOW OF PROCESS MATERIAL TO A DEPOSITION CHAMBER

BACKGROUND OF THE DISCLOSURE

1. Field of the Invention

The present invention is directed toward the field of manufacturing integrated circuits. The invention is more particularly directed toward an improved apparatus and method for controlling the flow of process material into a thin film deposition system.

2. Description of the Related Art

Presently, aluminum is widely employed in integrated circuits as an interconnect, such as plugs and vias. However, higher device densities, faster operating frequencies, and larger die sizes have created a need for a metal with lower resistivity than aluminum to be used in interconnect structures. The lower resistivity of copper makes it an attractive candidate for replacing aluminum.

A well established technique for depositing copper is through the use of chemical vapor deposition ("CVD") processing. For example, chemical vapor deposition of copper is achieved by using a precursor known as Cupraselect®, which has the formula Cu(hfac)L. Cupraselect® is a registered trademark of Schumacher of Carlsbad, Calif. The Cupraselect® consists of copper (Cu) bonded to a deposition controlling compound such as (hfac) and a thermal stabilizing compound (L). The (hfac) represents hexafluoroacetylacetonato, and (L) represents a ligand base compound, such as trimethylvinylsilane ("TMVS").

During the CVD of copper using Cu(hfac)L, the precursor is vaporized and flowed into a deposition chamber containing a wafer. In the chamber, the precursor is infused with thermal energy at the wafer's surface. At the desired temperature the following reaction results:

$$2Cu(hfac)L \rightarrow Cu+Cu(hfac)_2+2L \qquad \text{(Eqn. 1)}$$

resulting copper (Cu) deposits on the upper surface of the wafer. The byproducts of the reaction (i.e., Cu(hfac)$_2$ and (2L)) are purged from the chamber which is maintained at a vacuum during wafer processing.

FIG. 1 illustrates a copper CVD system of the prior art. Specifically, a copper deposition system 90, comprises a deposition chamber 100, pressure control unit 120, a precursor delivery system 130, and a gas delivery system 140. The chamber 100 is defined by sidewalls 102, floor 104 and lid 106. Process gases A and B are introduced to the chamber 100 through a showerhead 108 incorporated into the lid 106. The pressure control unit 120, (e.g., a vacuum pump), is coupled to the process chamber 100 via a valve 122 (e.g., a throttle valve) to control the chamber pressure.

In the precursor delivery system 130, liquid precursor such as Cupraselect® flows from ampoule 132 through a liquid mass flow controller (LMFC) 134, a valve 136 to a tee 138 via conduction lines 133 and 135. In the gas delivery system, a gas "A" is delivered to the tee 138 from a gas "A" source 142 via a mass flow controller (MFC) 144 and valve 146. The Gas "A", an inert gas such as argon or helium, facilitates the flow of liquid precursor from the tee 138 to the showerhead 108. The gas delivery system 140 also delivers a Gas "B", e.g., Argon, directly to the showerhead 108 via a gas "B" source 141, mass flow controller 143 and valves 145 and 147. In the showerhead 108, the liquid precursor expands into a mist and mixes with gas "B". The showerhead 108 contains a hot plate 115 that is heated by, for example a resistive coil. The precursor mist evaporates upon striking the hot plate 115 and forms a vapor.

The deposition chamber 100 further contains a heated susceptor 112 (workpiece support) for retaining a substrate 116 such as a semiconductor wafer onto which copper is to be deposited. The susceptor 112 is fabricated from a durable metallic material such as aluminum or a ceramic material such as aluminum nitride or boron nitride. The susceptor 112 also contains additional components such as resistive heater coils 113 to generate heat within the substrate support 112 which is conducted to the wafer 116. Copper is deposited onto the substrate 116 by CVD when the vaporized precursor contacts the heated wafer.

One problem associated with using Cupraselect® for CVD is the complicated delivery process used to couple the material from the liquid storage ampoule to the process chamber 100. In the prior art, the liquid Cupraselect® is mixed with a gas "A" such as Argon, Helium or any other inert gas between the ampoule 132 and the process chamber 100. To precisely deposit a thin layer of copper on the wafer surface, the flow of Cupraselect® to the vaporizer must be carefully controlled. In the prior art, a gate valve or isolation valve is needed to create a low pressure space to ensure Cupraselect® evaporation and fast pump-down through a separate diverter path. Such valves provide for high throughput but, unfortunately, have moving parts and O-ring seals that present a potential risk of mechanical particle generation. The gate valve and gas "A" delivery system also complicate the design and construction of the CVD system 90 and add to its cost. Therefore, the components used to deliver the precursor should be minimized so as to reduce cost and facilitate complete purging of the system when so needed.

Furthermore, in prior art systems, liquid precursor shut-off is problematic due to residual liquid precursor in the line between the tee 138 and the showerhead 108. This residual liquid precursor is continuously being drawn into the chamber 100 resulting in an over-flood of precursor. Consequently, the interior of the chamber 100 and other parts of the apparatus become undesirably coated. The coating subsequently flakes off into large particles which can contaminate the wafer 116 and other parts of the apparatus.

Accordingly, it is desirable to provide an apparatus and method for improved control of a precursor material in a substrate process system to reduce the likelihood of plating or particle formation within the system as well as increase deposition rate.

SUMMARY OF THE INVENTION

The disadvantages associated with the prior art are overcome with the present invention of an apparatus and method for controlling a flow of process material from a process material source to a chemical vapor deposition chamber. The apparatus comprises an injector valve, disposed proximate the deposition chamber. An injector driver controls the opening and closing of the injector valve. The injector valve controls the flow of precursor material by repeatedly opening and closing the injector valve with a predetermined duty cycle. Liquid precursor exiting the injector valve expands and atomizes into a fine mist. The apparatus further comprises an evaporator coupled to the injector valve for evaporating the atomized precursor. In a first embodiment of the present invention, the evaporator includes a heater in the shape of a spiral channel. In this embodiment, the injector valve and evaporator are combined as an injector-vaporizer mounted directly to the deposition chamber. In a second embodiment of the present invention, the evaporator is a hot plate disposed within deposition chamber.

The present invention is also operable in a deposition system comprising a deposition chamber and an injector-vaporizer that communicates with said chamber. The injector-vaporizer has a pressure regulator that maintains a constant pressure differential between an inlet and an outlet of the injector valve.

The apparatus and system of the present invention are operable by an inventive method in which the injector valve opens for a first predetermined period of time to permit a flow of process material and closes for a second predetermined period of time to prevent a flow of said process material. The opening and closing of the injector valve is cycled for a third predetermined amount of time. Such a method is, for example, operable as program code embodied in a computer readable storage medium.

All of these aspects of the present invention lead to improved control over the delivery and vaporization of precursor material to the deposition chamber. The invention therefore allows better control of the deposition rate of material and allows for lower pressure operating regimes in the chamber. As such, there is a reduced tendency for the precursor material to break down and undesirably deposit or form particles in the system (i.e., anywhere besides on the substrate to be processed). Hence, system reliability and repeatability is improved.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The novel features of the present invention provide for the controlled delivery of a precursor material (i.e., Cupraselect® for copper CVD) to a deposition system in a controlled fashion without compromising or unduly adding to the complexity of the system. Such features also provide for lower operating pressures, improved deposition rate and throughput of the system. The subject invention provides for improved control of the flow of process material. Although the invention is described in terms of copper thin films grown by CVD, those skilled in the art will recognize that the invention may be applied to any thin film deposition process where it is desirable to maintain controlled and repeatable delivery of process material to improve the resultant film and reduce contamination levels in the system.

Figure 1:
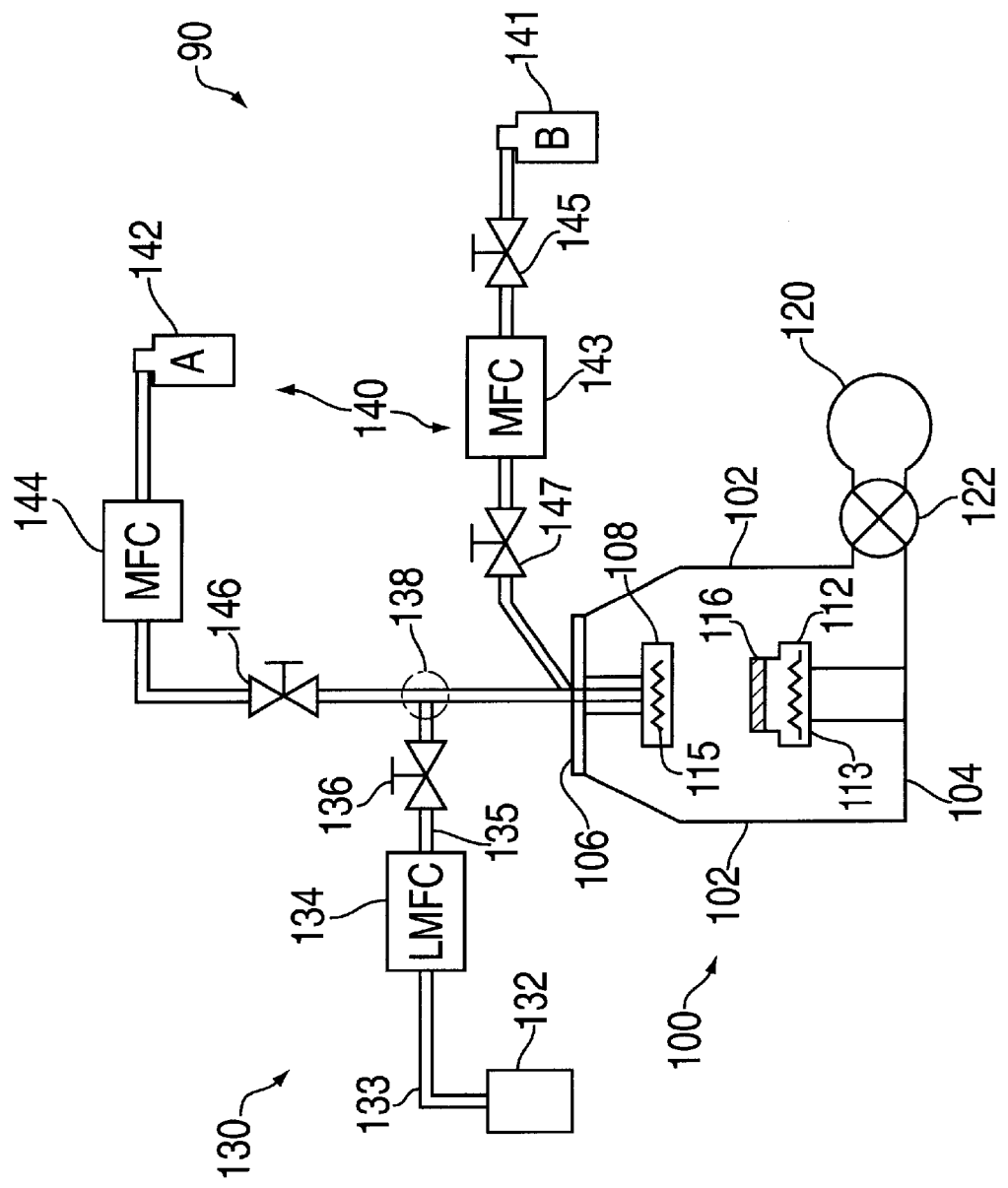
FIG. 1 illustrates a schematic of a CVD copper deposition system of the prior art.
Figure 2:
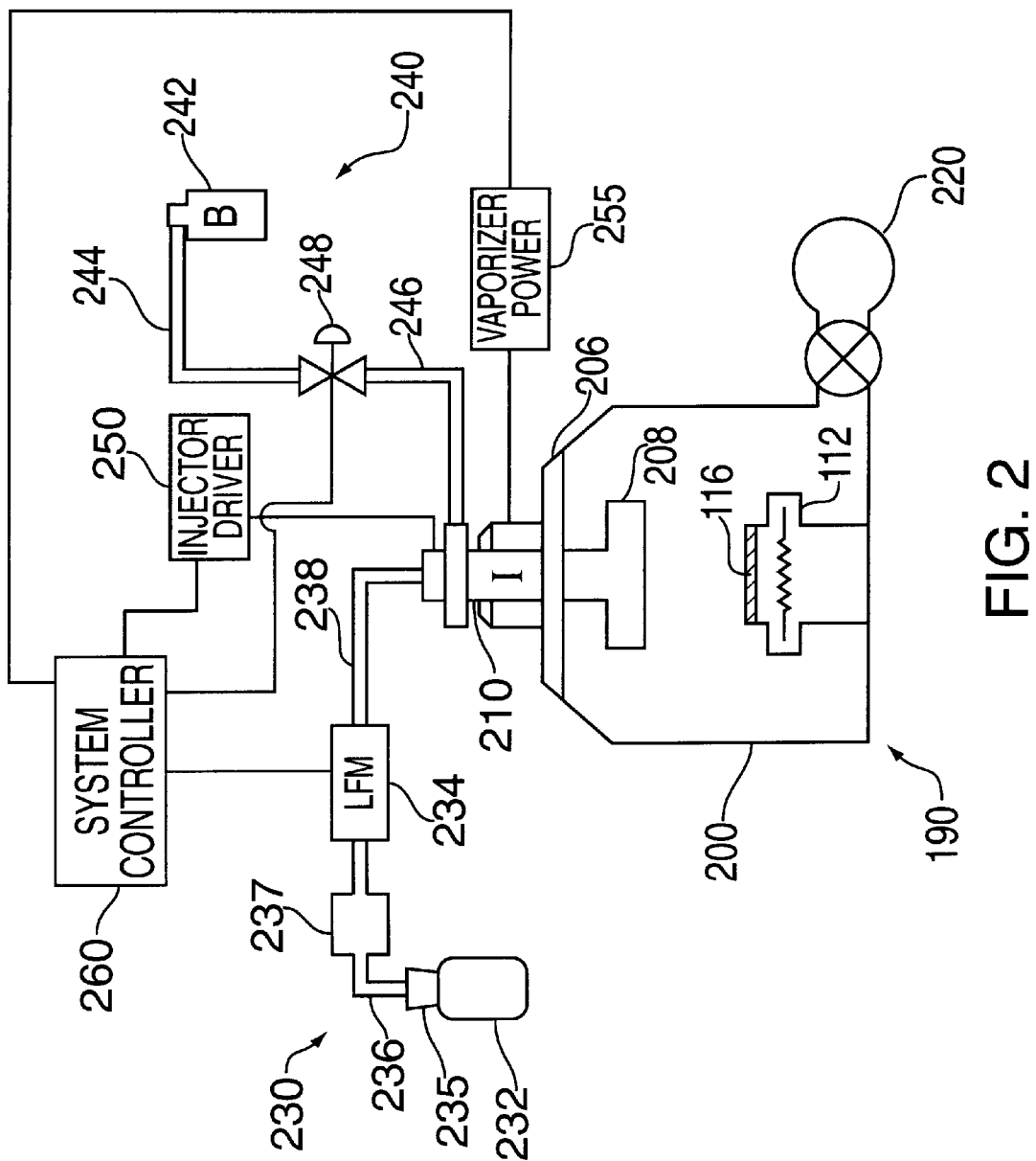
FIG. 2 illustrates a schematic of a CVD copper deposition system of a first embodiment of the present invention.

A first embodiment of the apparatus of the present invention is depicted in FIG. 2. Specifically, a deposition system 190, comprises a deposition chamber 200, an injector-vaporizer 210, a pressure control unit 220, a precursor delivery system 230, a gas delivery system 240, an injector driver 250 and a system controller 260. One example of a deposition chamber 200 that can be used is a model CuxZ chamber manufactured by Applied Materials, Inc. of Santa Clara, Calif., that is designed to perform copper deposition in accordance with the present invention. In a preferred embodiment, the invention incorporates the use the precursor Cupraselect®. This however does not preclude the use of other precursors and additives that are well known to those skilled in the art of CVD.

In the precursor delivery system 230, a precursor material, such as liquid Cupraselect® is delivered to the injector-vaporizer 210 from one or more process material sources, such as an ampoule 232, to the injector-vaporizer 210. Process material flows through conduction lines 236 and 238. An optional liquid flow meter (LFM) 234 connected to conduction lines 236 and 238 may be used to monitor the flow rate of liquid precursor. The precursor delivery system 230 further comprises a pressure regulator 235 and a damper 237 connected to the conduction line 236 or 238 between the ampoule 232 and the injector-vaporizer 210. The regulator 235 pressurizes the liquid precursor to 10–65 psi, preferably 65 psi, while the damper 237 reduces pressure fluctuations in the line 236 as the valve opens and closes. In the gas delivery system 240, a carrier gas "B", such as Argon is delivered from a carrier gas source 242 to the injector-vaporizer 210 via gas conduction lines 244 and 246 and a valve 248. The injector-vaporizer 210 is disposed proximate the chamber 200 and in a preferred embodiment, is attached directly to a lid 206 of the chamber 200. The injector-vaporizer 210 communicates with a showerhead 208 disposed within the chamber 200. Process gases such as vaporized precursor and/or carrier gas flow from the injector-vaporizer 210 to the chamber 200 via the showerhead 208. The precursor and carrier gas are delivered from the showerhead 208 to a wafer 116 retained on a susceptor 112 within the chamber 200. The operation of the injector-vaporizer 210 is controlled by the injector driver 250 and a vaporizer power supply 255, both of which are responsive to signals from the system controller 260 that controls the operation of the entire deposition system 190.

Figure 3:
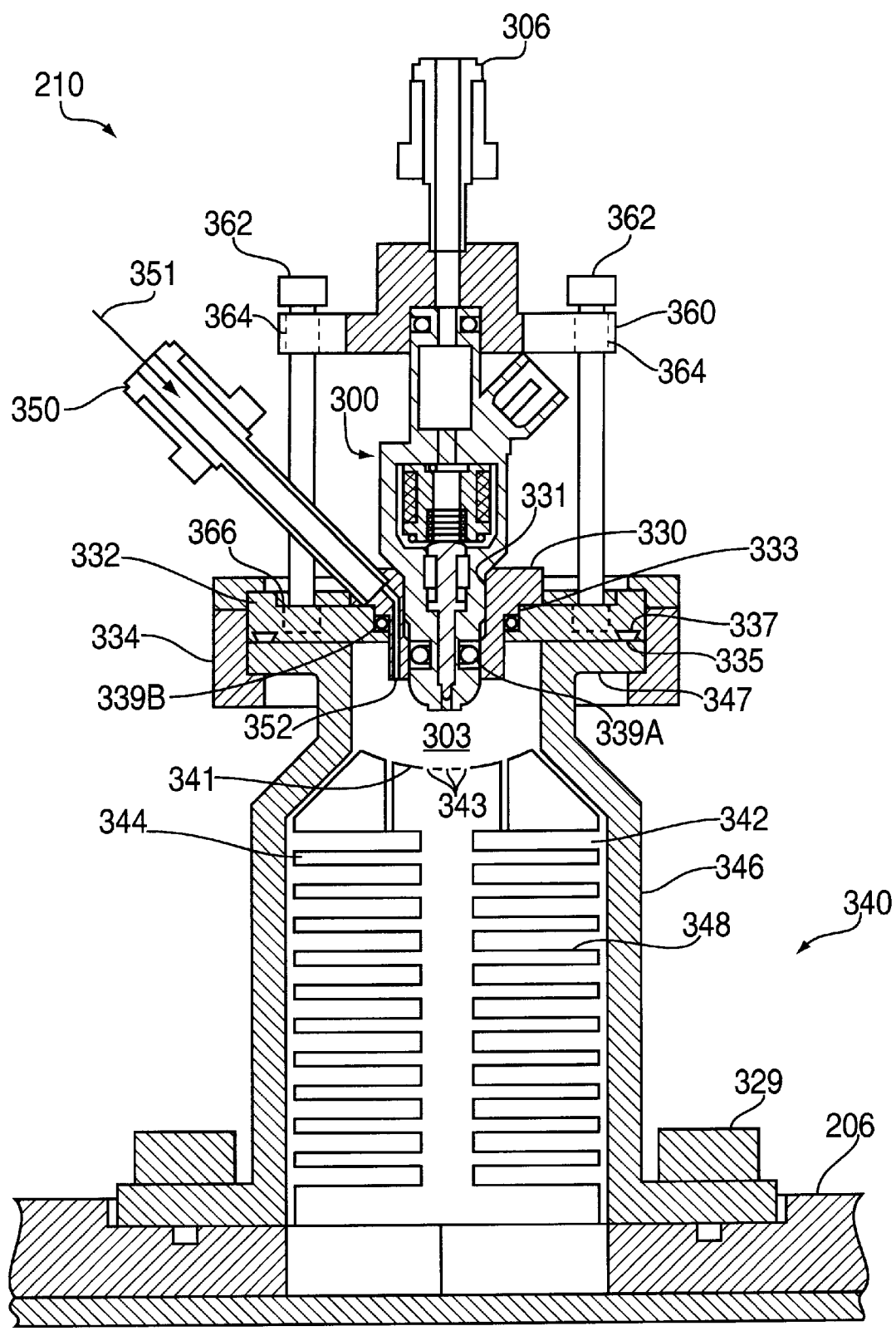
FIG. 3 illustrates a partial cross-sectional view of an injector-vaporizer of the first embodiment of the present invention.

The injector-vaporizer 210, shown in FIG. 3, comprises a solenoid operated liquid injector valve 300, a precursor inlet 306, an evaporator 340 and a gas B port 350. The injector-vaporizer 210 is secured to the lid 206 of the chamber 200 by conventional means such as bolts 329. The injector-vaporizer 210 regulates the flow of the precursor-carrier gas mixture to the chamber 200, atomizes the liquid precursor into a fine mist, mixes the atomized precursor with carrier gas and evaporates the precursor mist. Preferably, the injector-vaporizer 210 should be sealed to meet a helium leak test. An injector valve suitable for use with the present invention is a fuel injection valve model number 280-150-715 manufactured by Bosch of Stuttgart, Germany.

Figure 4A:
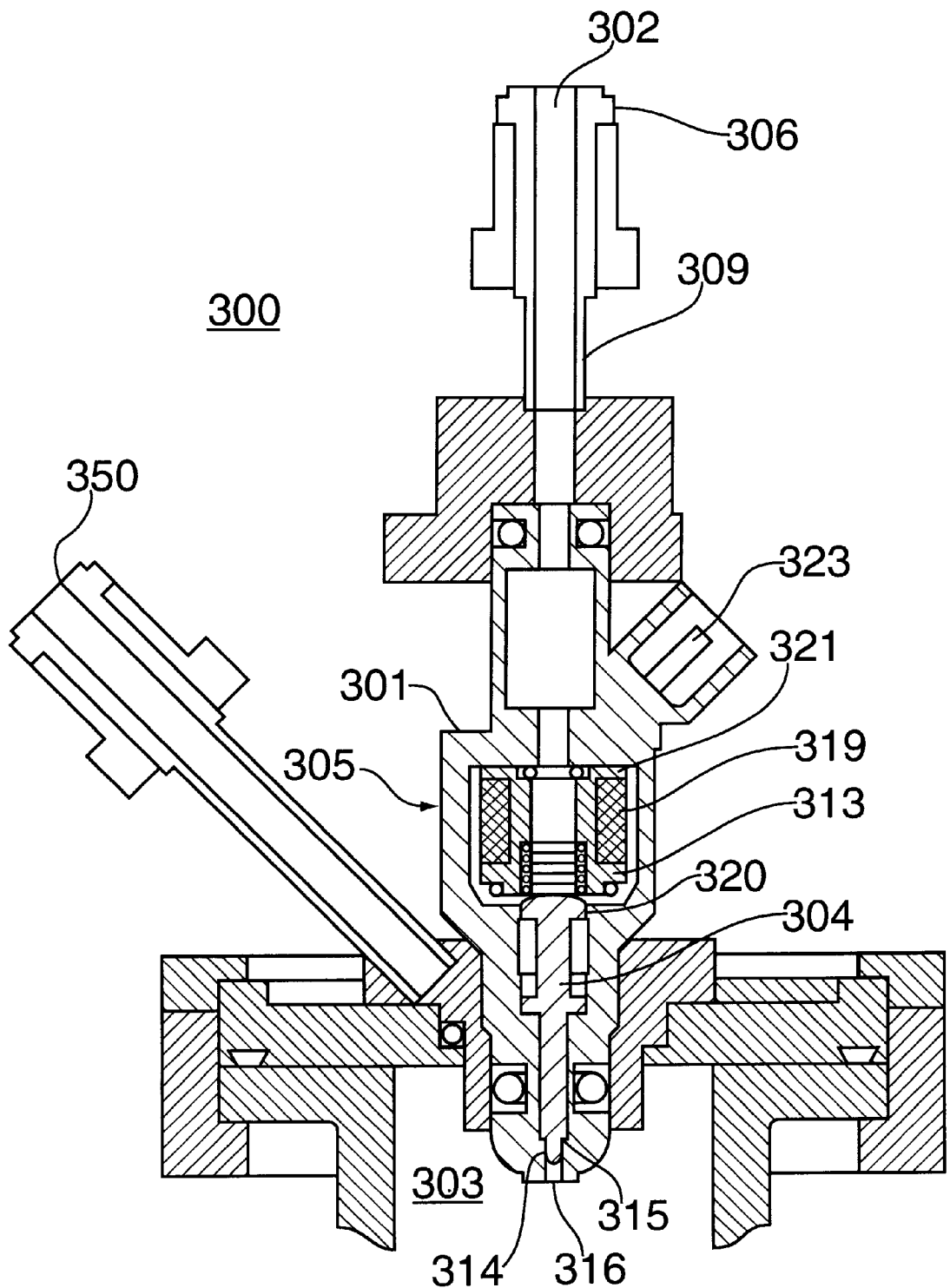
FIG. 4A illustrates a detailed cross-sectional view of an injector of the present invention.

The interior details of the injector valve 300 are depicted in FIG. 4A. The injector valve 300 generally comprises a valve body 301, and a solenoid 305. A precursor channel 302 extends the length of the valve body 301 and communicates with an atomizer chamber 303. A valve needle 304 is disposed within the precursor channel 302. The valve needle 304 has an outer diameter that is slightly smaller than an inner diameter of the channel 302. Liquid precursor enters the channel 302 at the precursor inlet 306, flows around the valve needle 304, and, when the valve is open, enters the atomizer chamber 303 via an exit orifice 316. Liquid precursor is delivered to the channel 302 through a double-contained tube 309. The pressure regulator 235 and damper 237 maintain a constant pressure differential between the inlet 306 and the exit orifice 316 as the valve opens and closes. A constant pressure differential insures a precise and reproducible delivery of precursor to the evaporator 340.

Continuing with FIG. 4A, a sealing end 314 of the valve needle 304 seals against a valve seat 315 at the exit orifice 316. The valve needle 304 moves between a first position in which the exit orifice 316 is blocked and a second position in which the exit orifice 316 is unblocked. In the first position, the sealing end 314 of the valve needle 304 engages the valve seat 315 thereby preventing precursor from entering the atomizer chamber 303. In the second position the valve needle 304 is retracted to allow precursor to flow around the sealing end 314 and through the exit orifice 316 thereby allowing precursor material to enter the atomizer chamber 303. Motion of the valve needle is actuated by the solenoid 305.

The solenoid 305 comprises, for example, multiple coiled turns 319 of electrically conductive wire wrapped around a spool 321. Electrical power is provided from the injector driver 250 to the turns 319 via an electrical connection 323. When solenoid 305 is energized by passing an electric current from the injector driver 250 through the turns 319, a fringing magnetic field is generated proximate an actuator end 320 of the valve needle 304. The magnetic field exerts a force on the valve needle 304 that drives it axially along the precursor channel 302. A spring 313 disposed between the solenoid 305 and the valve needle 304 urges against the actuator end 320 to force the sealing end 314 against the valve seat 315 to close the exit orifice 316 of the injector valve 300. When the solenoid 305 is energized, the valve needle 304 moves upward and the injector valve 300 opens, when the solenoid 305 is not energized, the injector valve 300 closes. Preferably, the injector valve 300 has a very fast open/close cycle (preferably approximately 5 milliseconds) This feature ensures the precursor does not flood the atomizer chamber 303 and the evaporator 340.

Returning to FIG. 3, the injector valve 300 is releasably attached to a flange 347 at the top of an evaporator housing 346. Releasable attachment may be achieved, for example, by means of an adapter 330, a mounting plate 332 and a collar 334. The injector valve 300 fits into a bore 331 in the adapter 330. The adapter 330 fits into a bore 333 in the mounting plate 332. The collar 334 surrounds the flange 347 and the mounting plate 332. A seal 335, such as a gasket or O-ring, disposed in a groove 337 in the mounting plate 334 seals the evaporator 340 from the external environment. The collar 334 provides the compressive force which squeezes the seal 335.

The injector valve 300 is secured to the mounting plate 332 by conventional means such as a flange 360 and two or more lead screws 362. The lead screws 362 engage bores 364 in the flange 360 and bores 366 in the mounting plate 332 such that when the lead screws 362 turn the injector valve is pressed against the adapter and the adapter 330 is pressed against the mounting plate 332. O-rings 339A and 339B provide vacuum tight seals between the injector valve 300 and the adapter 330, and the adapter 330 and the mounting plate 332. O-ring 339A is a piston seal that forms a seal between the valve body 301 and the bore 331 in the adapter 330. The lead screws 362 provide the necessary force to compress the O-ring 339B to form a seal between the adapter 330 and the mounting plate 332.

Carrier gas "B" is admitted to the atomizer chamber 303 along a path shown by the arrow 351 through the adapter 330 via a gas "B" channel 352. Carrier gas enters the channel 352 via a gas port 350. The carrier gas and precursor mix in the atomizer chamber 303, where the liquid precursor expands into a fine mist of atomized droplets. The atomized precursor and carrier gas enter the evaporator 340 via a grating 341 having plurality of holes 343.

Figure 4B:
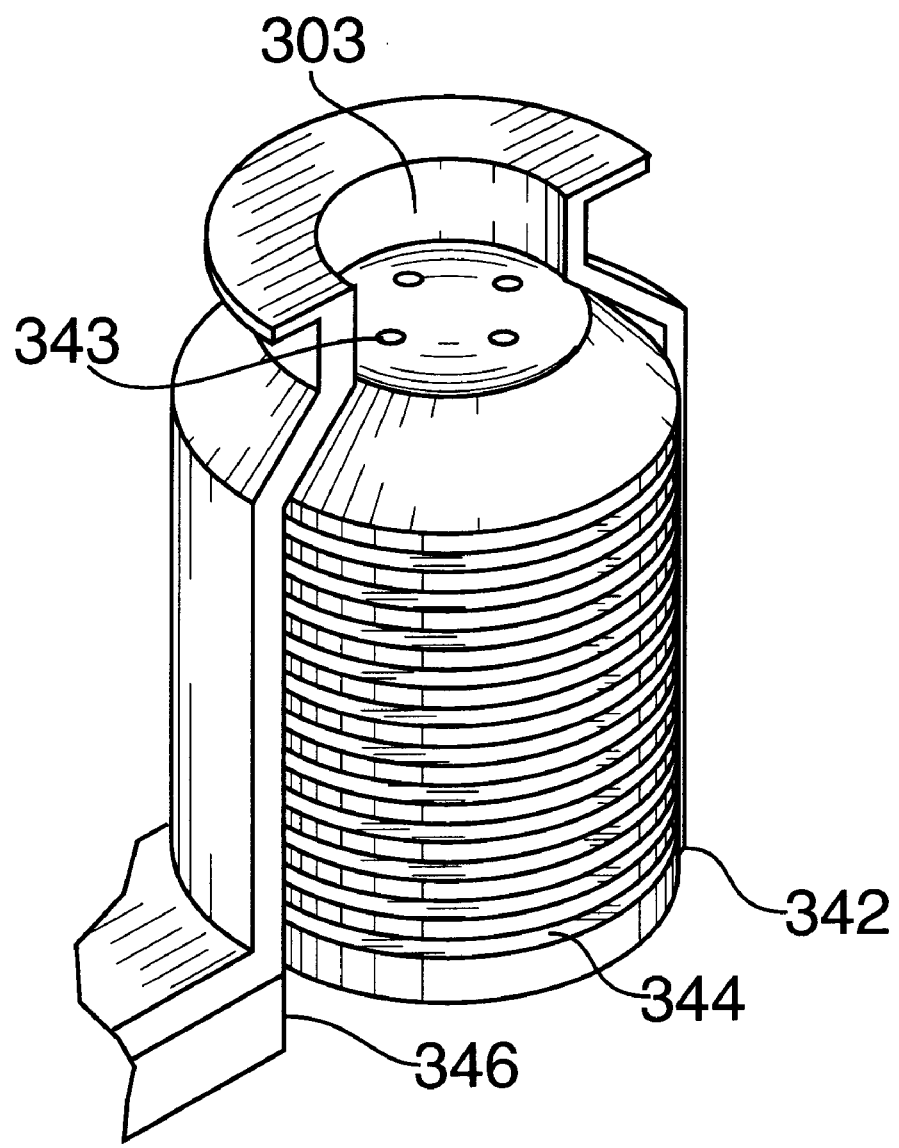
FIG. 4B illustrates a partial cross-sectional perspective view of the evaporator of the present invention.

The evaporator 340 is heated so that the atomized precursor vaporizes. As seen in FIG. 4B, the evaporator 340 comprises one or more helical channels 342 defined by a spiral shaped heating segment 344 contained within the evaporator housing 346. Preferably, the evaporator housing 346 is made of quartz. The housing 346 may be made of other materials provided the heating segment 344 is electrically isolated from other parts of the apparatus. The coil shape features many extended surfaces 348 to enhance heat transfer to the atomized precursor. The coil shaped channels 342 also enhance mixing of the vaporized precursor and carrier gas. The heating segment 344 is resistively heated by passing an electrical current through it. The heating segment 344 is, for example, made of nickel-based alloy wires that are either exposed or encapsulated in an Inconel® cartridge. Inconel is a registered trademark of Inco International Alloys, Inc., of Huntington, W.Va. The current can be supplied by conventional means such as the vaporizer power supply 255.

The proximity of the injector-vaporizer 210 to the chamber is advantageous as the vapor created does not have to travel over a large distance before dispersion into the chamber. As such, less plating or clogging of transfer lines is likely. Moreover, the close proximity of the injector-vaporizer 210 to the chamber 200 significantly reduces the likelihood of pressure gradients that affect the deposition process. For example, if the deposition system 190 is operating at a pressure of 1.5 torr, a 0.5 torr drop in pressure is significant enough to degrade the properties of the film being deposited. Additionally, the proximity of the injector valve provides for faster processing of wafers by closing the chamber 200 to deposition material without a time lag associated with a valve further from the chamber. Byproducts of the deposition process can be pumped out of just the chamber instead of the extra volume of the delivery system also. Less excess process material is carried to the chamber which results in less extraneous deposition on chamber components and cross-contamination of neighboring chambers during wafer transfer.

Figure 9:
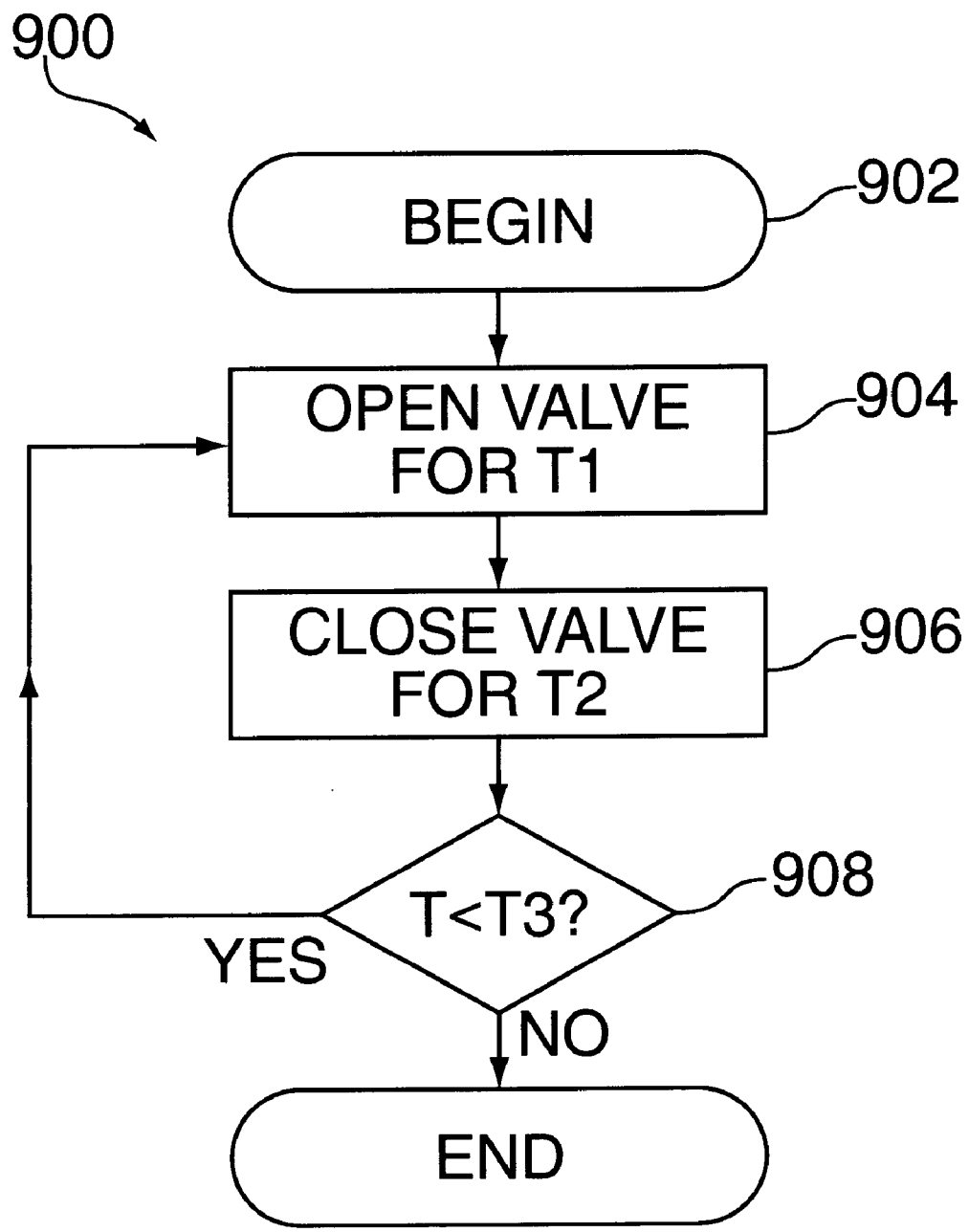
FIG. 9 illustrates a flow diagram of an alternate embodiment of the present invention.

An improved method for controlling a flow of process material is also described as part of the subject invention. According to the method, the flow of liquid precursor through the injector-vaporizer 210 is pulsed by alternately opening and closing the injector valve 300. FIG. 9 depicts a flow diagram of the method of the present invention. The method 900 begins at step 902 with the valve closed. In step 904, the injector valve 300 is opened for a first period of time T1. At step 906, the injector valve 300 is closed for a second period of time T2. The opening and closing steps are repeatedly cycled at step 908 until a third period of time T3 has elapsed. After the third period of time has elapsed, the method ends at step 908 with the injector valve 300 closed.

Figure 5:
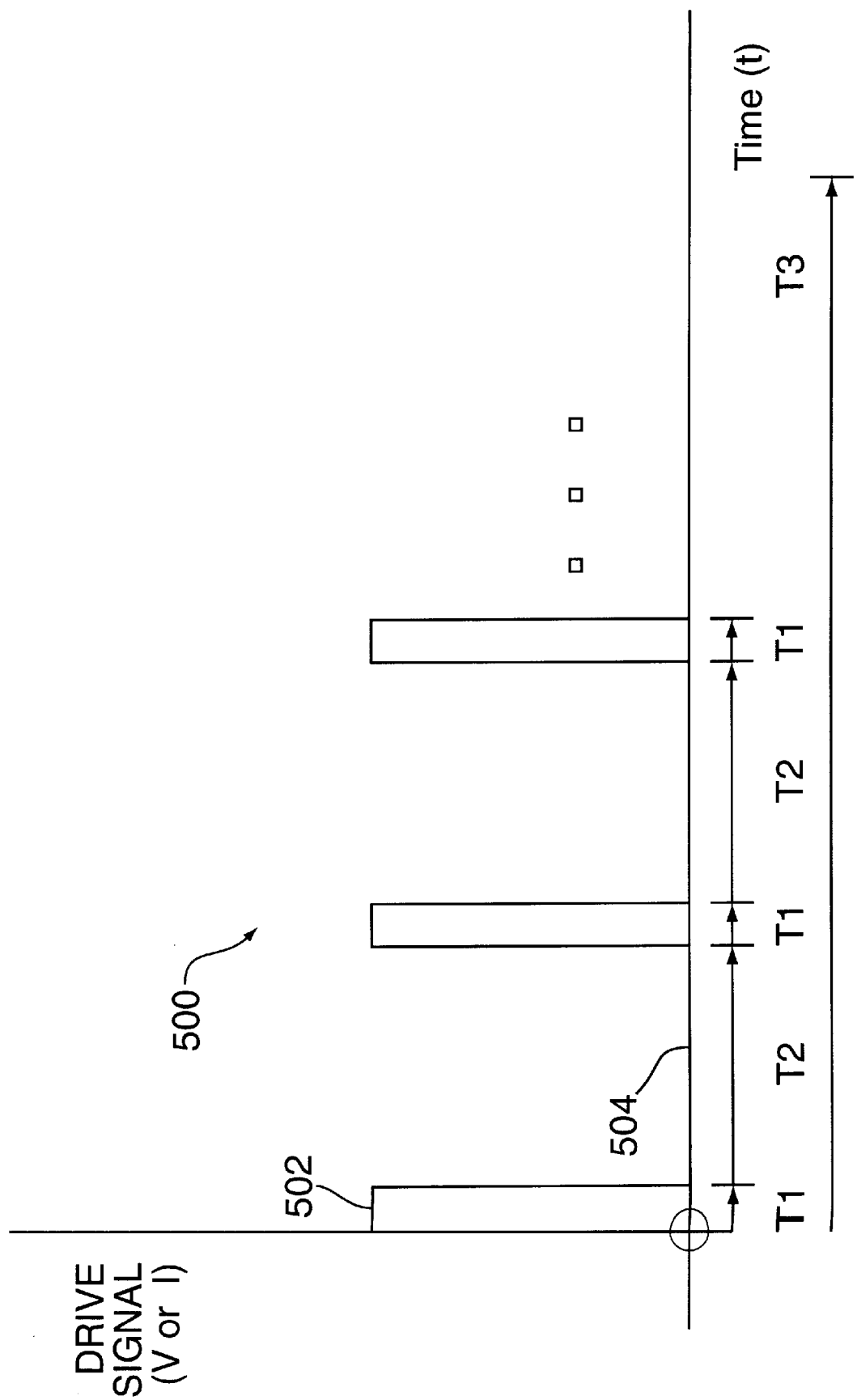
FIG. 5 is a timing diagram of the pulsed flow of process material in the method of the present invention.

FIG. 5 depicts a timing diagram of a drive signal 500 produced by the injector driver 250 that controls the operation of the injector valve 300. The drive signal 500 represents a voltage or current delivered to the solenoid 305. When the signal 500 is at a first level 502, the solenoid is energized and the injector valve 300 is opened. When the signal 500 is at a second level 504, the solenoid is not energized and the injector valve 300 is closed. The injector driver 250 maintains the signal 500 at the first level 502 for a period of time T1. T1 is typically between approximately 2 milliseconds and 30 milliseconds, preferably about 5 ms. The injector driver then changes the signal 500 to level 504 for a period of time T2. T2 is typically between approximately 1 and 10 seconds, preferably approximately 2 seconds. Note that y-axis denoting time in FIG. 5 is not drawn to scale. The valve therefore opens and closes over a duty cycle of duration T1+T2 (typically about 2.005 seconds). The flow rate can be adjusted between approximately 0.5 and 5 cc/min by varying the parameters. For example, the valve typically operates with approximately a 2 second duty cycle during which the valve is open for approximately 5 milliseconds. With a constant liquid pressure, e.g., 65 psi, the flow rate can be increased by decreasing T2, for fixed T1. Alternatively, decreasing T1, for fixed T2 decreases the flow rate. For a fixed flow rate, the amount of material that flows through the valve can be controlled by repeating the duty cycle for a period of time T3. T3 is typically between approximately 10 and 60 seconds, preferably approximately 30 seconds. T3 should be as short as possible to reduce throughput. Additionally, the valve timing need not start at the first level where the valve is opened. That is, T1 and T2 may be shifted up or down in the duty cycle so that the valve is opened at any time during the duty cycle.

Figure 6:
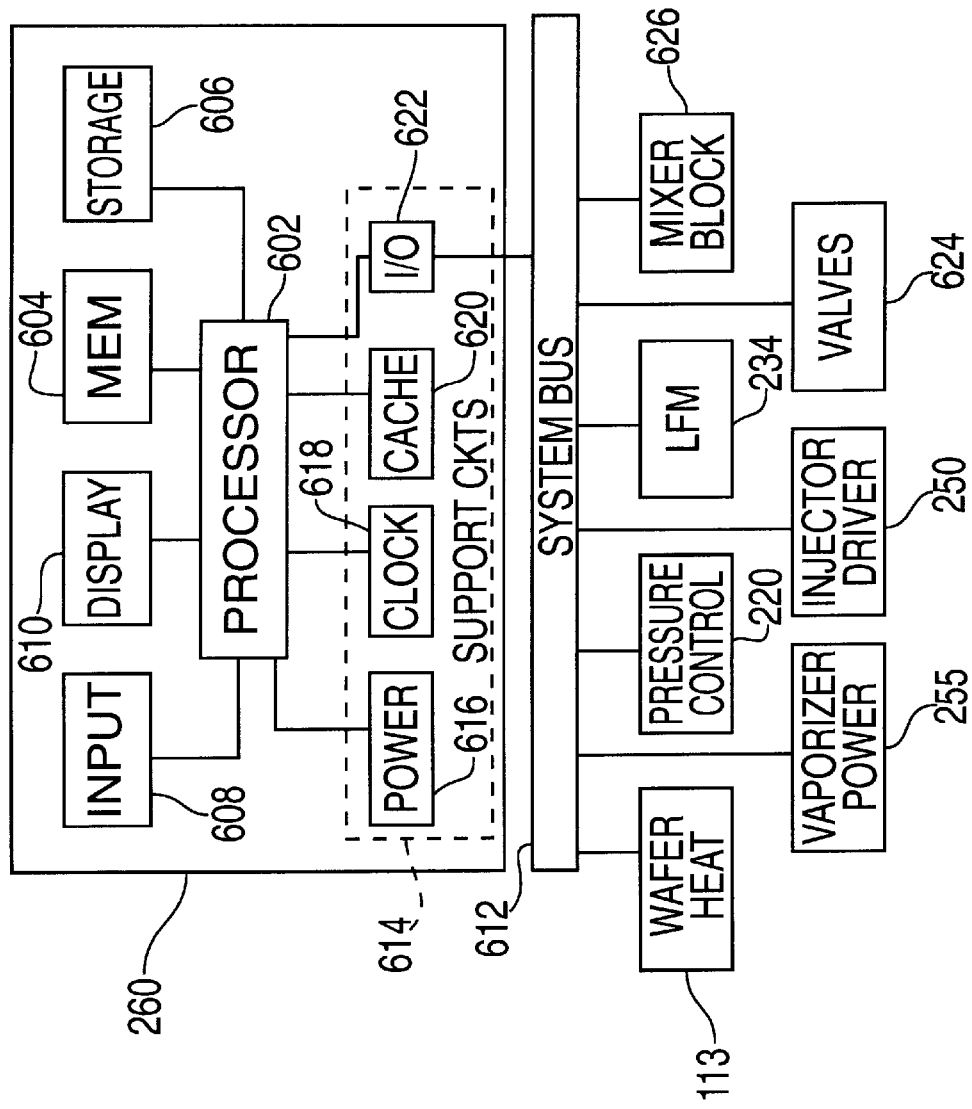
FIG. 6 illustrates a system block diagram of the CVD copper deposition system of the present invention.

The above-described apparatus and method can be employed in a system that is controlled by a processor based system controller 260 (FIG. 2). FIG. 6 shows a block diagram of a deposition system 190, such as that depicted in FIG. 2, having such a system controller 260 that can be employed in such a capacity. The system controller unit 260 includes a programmable central processing unit (CPU) 602 that is operable with a memory 604, a mass storage device 606, an input control unit 608, and a display unit 610. The system controller further includes well-known support circuits 614 such as power supplies 616, clocks 618, cache 620, input/output (I/O) circuits 622 and the like. The controller 260 also includes hardware for monitoring wafer processing through sensors (not shown) in the chamber 200. Such sensors measure system parameters such as wafer temperature, chamber atmosphere pressure and the like. All of the above elements are coupled to a control system bus 612.

The memory 604 contains instructions that the processor unit 602 executes to facilitate the performance of the deposition system 190. The instructions in the memory 604 are in the form of program code. The program code may conform to any one of a number of different programming languages. For example, the program code can be written in C, C++, BASIC, Pascal, or a number of other languages.

The mass storage device 606 stores data and instructions and retrieves data and program code instructions from a processor readable storage medium, such as a magnetic disk or magnetic tape. For example, the mass storage device 606 can be a hard disk drive, floppy disk drive, tape drive, or optical disk drive. The mass storage device 606 stores and retrieves the instructions in response to directions that it receives from the processor unit 602. Data and program code instructions that are stored and retrieved by the mass storage device 606 are employed by the processor unit 602 for operating the deposition system 190. The data and program code instructions are first retrieved by the mass storage device 606 from a medium and then transferred to the memory 604 for use by the processor unit 602.

The input control unit 608 couples a data input device, such as a keyboard, mouse, or light pen, to the processor unit 602 to provide for the receipt of a chamber operator's inputs. The display unit 610 provides information to a chamber operator in the form of graphical displays and alphanumeric characters under control of the processor unit 602.

The control system bus 612 provides for the transfer of data and control signals between all of the devices that are coupled to the control system bus 612. Although the control system bus is displayed as a single bus that directly connects the devices in the processor unit 602, the control system bus 612 can also be a collection of busses. For example, the display unit 610, input control unit 608 and mass storage device 606 can be coupled to an input-output peripheral bus, while the processor unit 602 and memory 604 are coupled to a local processor bus. The local processor bus and input-output peripheral bus are coupled together to form the control system bus 612.

The system controller 260 is coupled to the elements of the deposition system 190, employed in copper CVD in accordance with the present invention via the system bus 612 and the I/O circuits 622. These elements include the following: a plurality of valves 624 (such as valve 248 of FIG. 2), the heating element 113, the pressure control unit 220, the liquid flow meter 234, injector driver 250, the vaporizer power supply 255, and an optional mixer block 626 (not shown in FIG. 2, but may be connected to either the precursor delivery system 230 or chamber 200). The system controller 260 provides signals to the chamber elements that cause these elements to perform operations for forming a layer of copper in the subject apparatus.

Figure 7:
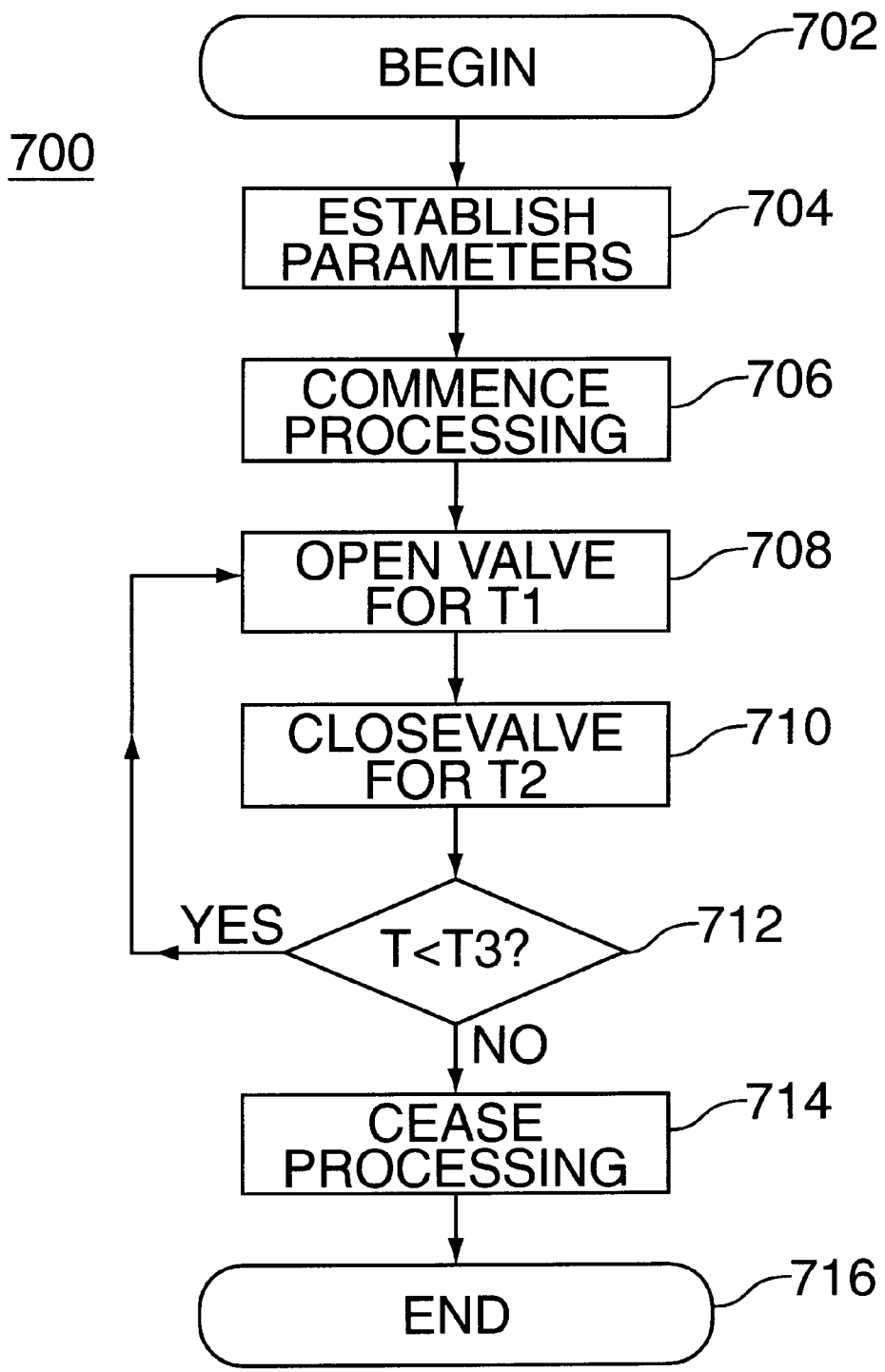
FIG. 7 illustrates a flow diagram for one embodiment of the method of the present invention.

Those skilled in the art would be readily able to devise a computer program such as a program 700 depicted in the flow diagram of FIG. 7 to control a flow of process material in accordance with the present invention. The program 700 is suitable for monitoring and controlling a copper CVD process. Although the program 700 is described herein with respect to a copper CVD process, those skilled in the art will recognize that the method of the present invention can be applied to any wafer process.

The program begins at step 702. System operating parameters are established in step 704. In operation, the processor unit 602 directs the operation of the chamber elements in response to the program code instructions that it retrieves from the memory 604. For example, once a wafer 116 is placed in the processing chamber 200, the processor unit 602 executes instructions retrieved from the memory 604 such as activating the heating element 113 to heat the wafer 116, controlling valves 624 to permit the flow of precursor material and carrier gas, moving susceptor 112 into position for CVD and the like. Injector driver parameters T1, T2 and T3 are initialized at this time. These values can be part of the code of program 700, or entered by an operator at the input unit 608, or otherwise retrieved from the memory 604 or the mass storage device 606.

Processing commences at step 706. For example the processor unit 602 executes instructions directing valve 248 to open to permit the flow of gas "B". The processor unit 602 may instruct the vaporizer power supply 255 to provide current to the heating segment 344 of the evaporator 340. The processor unit 602 instructs the injector driver 250 to send a signal to the injector valve 300 initiating a plurality of duty cycles as described above with respect to FIG. 5. Once processing commences, the program 700 measures an elapsed time T by, for example, referring to a signal from the clock 618. The injector driver 250 opens the injector valve 300, at step 708, to permit a flow of process material for a first predetermined period of time T1. At step 710 the injector driver 250 closes the injector valve 300 to prevent the flow of process material for a second predetermined period of time T2. At step 712, the program 700 executes a set of instructions that compares the elapsed time T to the third predetermined time T3. The opening and closing steps are repeatedly cycled until the elapsed time T equals T3.

As long as the injector valve 300 cycles open and closed, precursor material flows from the precursor ampoule 232 to the evaporator 340 where it is vaporized. Vaporized precursor material flows to the chamber 200. When vaporized precursor material strikes the heated wafer copper is deposited by CVD as described above. When the third predetermined amount of time T3 has elapsed (i.e., T=T3) the injector driver 250 signals the injector valve 300 to remain shut, at step 714 and processing ceases. The program then ends at step 716.

The execution of these instructions results in the elements of the deposition system 190 being operated to deposit a layer of material on a substrate.

Although a computer program has been disclosed as being capable of producing the drive signals, the system controller may issue simple "start" and "stop" signals to a dedicated injector timing circuit built into the injector driver (250 of FIG. 2). Upon receiving a start signal, such a circuit (i.e., a pulse width modulating timer circuit coupled to a power transistor) automatically produces the control signals for driving the injector. The control signals cease upon the system controller issuing a stop signal.

Figure 8:
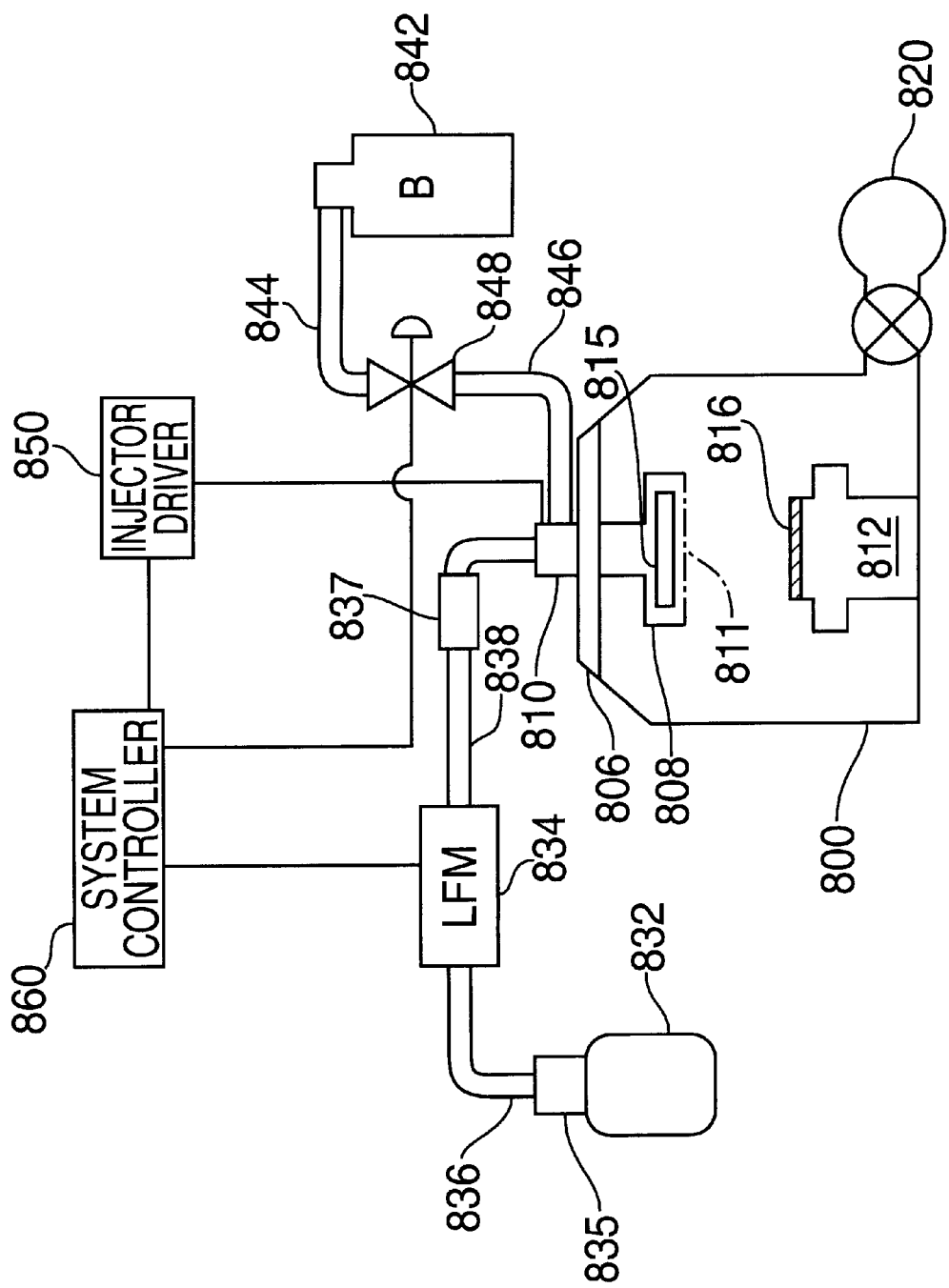
FIG. 8 illustrates an alternate embodiment of a deposition system of the present invention.

An alternate embodiment of the invention, depicted in FIG. 8, can also operate in accordance with the above method. In this embodiment, a deposition system 790, comprises a deposition chamber 800, an injector valve 810, a pressure control unit 820, an injector driver 850 and a system controller 860. As with the first embodiment, the deposition chamber 800 can be, for example, a model CuxZ chamber manufactured by Applied Materials, Inc. of Santa Clara, Calif. In the chamber 800, a wafer 816 is retained on a susceptor 812. Process material such as a precursor and/or carrier gas flow from the injector-valve 810 into the chamber 800 via a showerhead 808 disposed within the chamber 800. The operation of the injector-vaporizer 810 is controlled by the injector driver 850 which is responsive to signals from the system controller 860 that controls the operation of the entire deposition system 790. The injector-valve 810, injector driver 850 and system controller 860 are all operable as described above with respect to FIG. 5, FIG. 6 and FIG. 7.

A precursor material, such as liquid Cupraselect o is delivered to the injector valve 810 from one or more process material sources 832, to the injector valve 810 via conduction lines 836 and 838. A pressure regulator 835 and damper 837 are connected to the conduction line 836 or 838 between the process material source 832 and the injector vaporizer 810. An optional liquid flow meter (LFM) 834 connected to conduction lines 836 and 838 may be used to monitor the flow rate of liquid precursor. A carrier gas "B", such as Argon or Nitrogen from a carrier gas source 842, is delivered to the injector-vaporizer 810 via gas conduction lines 844 and 846 and a valve 848. The injector valve 810 is in turn attached directly to a lid 806 of the chamber 800. The injector valve 810 is comparable in construction and operation to the injector valve 300 depicted in FIG. 3 and FIG. 4.

The injector valve 810 communicates with the showerhead 808. Process material enters the chamber 800 via a plurality of orifices 811 in the showerhead 808. The showerhead 808 contains a hot plate 815. The hot plate 815 heats the showerhead 808 to approximately 65° C. which is a temperature suitable for vaporization of the liquid precursor material (i.e., Cupraselect®). The heating of the hot plate 815 is accomplished by any known and accepted means for chamber component heating such as, but not limited to, fluid exchange with fluid remotely heated, resistive heating elements contained in or upon the hot plate 815, heat lamps (not shown) within the chamber 800 or the like). As such, liquid precursor material vaporizes in the showerhead 808. An example of a suitable showerhead is discussed in a commonly assigned patent application serial number 09/120,004, filed Jul 21, 1998 and entitled "Method And Apparatus For Improved Control Of Process And Purge Material In A Substrate Processing System". Vaporized precursor flows through one of the plurality of orifices 811 in the showerhead 808. The hot plate 815 is thus an evaporator that performs the function of the evaporator 340 as described above with respect to FIG. 3.

The apparatus and method described above provide for an improved CVD operation by more delivering process material to a chamber in a more controlled fashion than in the prior art. Additionally, various features of the apparatus reduce the number complexity of components for delivery of process material to the chamber. As such, chamber performance is improved as measured by mean wafers before cleaning (MWBC). Also, assembly time and preventive maintenance down time are reduced.

Although various embodiments which incorporate the teachings of the present invention have been shown and described in detail herein, those skilled in the art can readily devise many other varied embodiments that still incorporate these teachings.

What is claimed is:

1. Apparatus for controlling a flow of process material to a deposition chamber, comprising an injector valve mounted directly on said deposition chamber, wherein the injector valve includes a valve body, a precursor channel, a valve needle, an exit orifice, and an atomizer chamber.

2. The apparatus of claim 1 further comprising an injector driver connected to the injector valve.

3. The apparatus of claim 2 wherein said injector driver causes said injector valve to repeatedly open and close with a predetermined duty cycle.

4. The apparatus of claim 1 further comprising an evaporator disposed between said injector valve and the deposition chamber.

5. The apparatus of claim 4 wherein said evaporator includes a heater in the shape of a spiral channel.

6. The apparatus of claim 4 wherein said evaporator is a hot plate disposed within said deposition chamber.

7. The apparatus of claim 1 wherein the process material is a precursor liquid containing copper.

8. The apparatus of claim 7 further comprising a carrier gas delivery system connected to the deposition chamber.

9. A deposition system for depositing a material upon a workpiece comprising:

a deposition chamber containing a workpiece support; and an injector-vaporizer mounted directly on said deposition chamber, wherein the injector-vaporizer includes a valve body, a precursor channel, a valve needle, an exit orifice, and an atomizer chamber.

10. The system of claim 9 wherein said injector-vaporizer comprises an injector-valve connected between a process material source and said deposition chamber.

11. The system of claim 10 wherein said injector valve controls a flow rate of process material to said deposition chamber by alternately opening to permit a flow of process material and closing to prevent said flow of process material.

12. The system of claim 11 further comprising an injector driver connected to said injector valve.

13. The system of claim 12 further comprising a pressure regulator located between a process material source and said injector vaporizer.

14. The system of claim 10 wherein said injector-vaporizer further comprises an evaporator disposed between the injector valve and said deposition chamber.

15. The system of claim 14 wherein said evaporator includes a heater in the shape of a spiral channel.

16. The system of claim 14 wherein said evaporator is a hot plate disposed within said deposition chamber.

17. The system of claim 10 further comprising a damper located between said process material source and said injector-vaporizer.

18. The system of claim 17 further comprising a pressure regulator located between said process material source and said injector vaporizer.

* * * * *